(12) United States Patent
Chen et al.

(10) Patent No.: US 8,429,335 B2
(45) Date of Patent: Apr. 23, 2013

(54) MEMORY DEVICE AND OPERATION METHOD TO SELECTIVELY INVERT DATA

(75) Inventors: Chung-Kuang Chen, Taipei (TW); Han-Sung Chen, Hsinchu City (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 383 days.

(21) Appl. No.: 12/577,891

(22) Filed: Oct. 13, 2009

(65) Prior Publication Data

US 2011/0087838 A1 Apr. 14, 2011

(51) Int. Cl.
*G06F 12/00* (2006.01)
(52) U.S. Cl.
USPC ............................. 711/103; 711/154

(58) Field of Classification Search .................. 711/103, 711/154
See application file for complete search history.

(56) References Cited

U.S. PATENT DOCUMENTS 5,959,882 A * 9/1999 Yoshida et al. .......... 365/185.03
7,804,726 B2 * 9/2010 Cho et al. ................. 365/189.16

\* cited by examiner

*Primary Examiner* — Kalpit Parikh
(74) *Attorney, Agent, or Firm* — McClure, Qualey & Rodack, LLP

(57) ABSTRACT

Provided is a MLC (Multi-level cell) memory device, comprising: a memory array, including a plurality of groups each storing a plurality of bits; and an inverse bit storage section, storing a first inverse bit data including a plurality of inverse bits, the plurality of bits in the same group in the memory array being related to a respective inverse bit.

18 Claims, 2 Drawing Sheets

MEMORY DEVICE AND OPERATION METHOD TO SELECTIVELY INVERT DATA

TECHNICAL FIELD

The present invention generally relates to a memory device and operation method therefor.

BACKGROUND

In recent years, non-volatile memories that are data-rewritable semiconductor devices are widely used. Multi-level cell (MLC) memories have a plurality of memory cells, each being divided into a left half cell and a right half cell. Each of the left half cell and the right half cell may store multi-bit, for example but not limited, 2 bits. During writing data into MLC memories, second bit effect in one half cell may be serious if there is too much charge trapped in the other half cell. Further, in reading distribution, if one distribution is too wide, the related sensing window(s) may be negatively affected.

BRIEF SUMMARY

Examples of The present invention are directed to a memory device and an operation method thereof, which inverts an original data into an input data, so that the input data has fewer logic "0" bits than the original data.

An embodiment of the present invention provides a MLC (Multi-level cell) memory device, comprising: a memory array, including a plurality of groups each storing a plurality of bits; and an inverse bit storage section, storing a first inverse bit data including a plurality of inverse bits, the plurality of bits in the same group in the memory array being related to a respective inverse bit.

Another embodiment of the present invention provides an operation method for a MLC (multi-level cell) memory device, comprising steps of: receiving an original data; determining whether to invert the original data into a first input data; generating a first inverse bit data based on the determination, the first inverse bit data indicating that whether the original data is inverted into the first input data or not, the first inverse bit data including a plurality of inverse bits; and storing the first input data and the first inverse bit data into the memory device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF EXEMPLARY EMBODIMENT OF THE INVENTION

Figure 1:
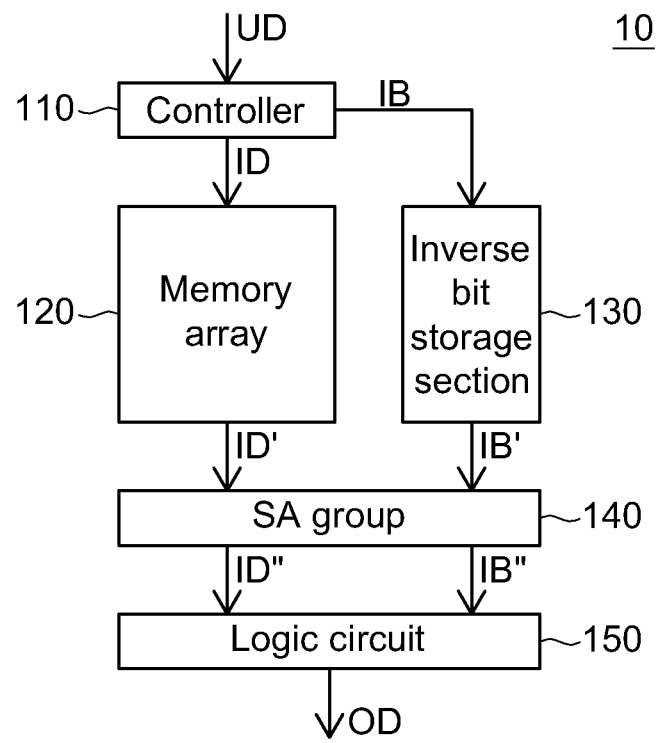
FIG. 1 shows a functional block diagram of a memory device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 shows a functional block diagram of a memory device according to an embodiment of the invention. As shown in FIG. 1, the memory device 10 according to the embodiment of the invention at least includes a controller 110, a memory array 120, an inverse bit storage section 130, a sense amplifier (SA) group 140 and a logic circuit 150.

The controller 110 receives user data (i.e. the original data) UD. The controller 110 determines whether to invert the user data UD. Based on the determination, the controller 110 outputs a first input data ID and a first inverse bit data IB to the memory array 120 and the inverse bit storage section 130, respectively. The first inverse bit data IB indicates that whether the user data had been inverted by the controller 110 into the first input data ID or not. The first inverse bit data IB includes a plurality of inverse bits.

The memory array 120 includes a plurality of memory cells. In this embodiment, the memory cells are for example MLCs; but in other embodiment, the memory cells may be single-level cells (SLCs). The memory array 120 receives the first input data ID from the controller 110.

The inverse bit storage section 130 stores the first inverse bit data IB from the controller 110. If the first inverse bit data IB is large (i.e. the first inverse bit data IB includes many inverse bits), then inverse bit storage section 130 may be implemented by an inverse bit array; and on the contrary, if the first inverse bit data IB is small (i.e. the first inverse bit data IB includes a few inverse bits), then inverse bit storage section 130 may be implemented by a register.

The sense amplifier (SA) group 140 senses a second input data ID' from the memory array 120 and senses a second inverse bit data IB' from the inverse bit storage section 130. The sense amplifier group 140 may include a plurality of sense amplifiers. The sense amplifier group 140 outputs a third input data ID" and a third inverse bit data IB" to the logic circuit 150. The logic circuit 150 inverts the third input data ID" into an output data OD, based on the third inverse bit data IB". In general (i.e. no reading error), the first input data ID, the second input data ID' and the third input data ID" should be the same; and the first inverse bit data IB, the second inverse bit data IB' and the third inverse bit data IB" should be the same. Further, in general (i.e. no reading error), the user data UD and the output data OD should be the same.

For example, the memory array 120 includes N1 sectors, each sector including N2 blocks, each block including N3 word lines and each word line including N4 pages, N1~N4 being natural numbers. In one embodiment, the first inverse bit data IB may include N1 inverse bits each related to one sector; and bits in the same sector are inverted or not based on its related inverse bit. Further, in still another embodiment, the first inverse bit data IB may include N1*N2 inverse bits each related to one block; and bits in the same block are inverted or not based on its related inverse bit. Further, in yet still another embodiment, the first inverse bit data IB may include N1*N2*N3 inverse bits each related to one word line; and bits in the same word line are inverted or not based on its related inverse bit. Further, in yet still another embodiment, the first inverse bit data IB may include N1*N2*N3*N4 inverse bits each related to one page; and bits in the same page are inverted or not based on its related inverse bit. Still further, the page may be divided into a plurality of sub-page. For example, if each page is divided into N5 sub-pages (N5 being a natural number), then the first inverse bit data IB may include N1*N2*N3*N4*N5 inverse bits each related to one sub-page; and bits in the same sub-page are inverted or not based on its related inverse bit. Further, bit number in each sub-page may be the same as or different from each other. For example but not limited, in a page, a first sub-page may have 32 bits while a second sub-page may have 50 bits. Bits in the first sub-page are inverted or not based on a related inverse bit; and bits in the second sub-page are inverted or not based on another related inverse bit.

In the memory array 120, in the same word line, a page may include consecutive memory cells or separated memory cells.

In the following, how to determine whether to invert the user data is described. In here, it is assumed that the memory device 10 is a MLC memory device and each of the memory cells thereof is divided into a left half cell and a right half cell. Each of left half cell and the right half cell stores two bits. Further, the two bits in the left half cell belong to different pages; and similarly, the two bits in the right half cell belong to different pages. Sometimes, the two bits in the left half cells are referred as a high bit and a low bit, respectively. The high bit and the low bit belong to a high page and a low page, respectively. Each of the high page and the low page relates to a respective inverse bit.

Figure 2:
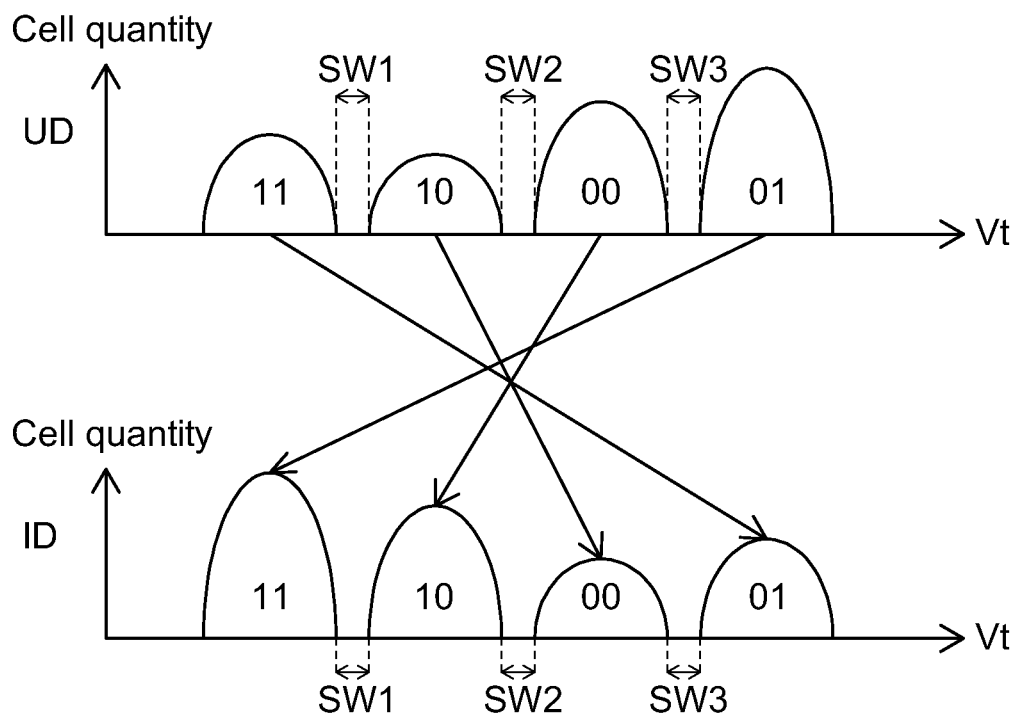
FIG. 2~FIG. 4 show reading distribution situations in one half cell (for example, left half cell), before and after bit inversion.
Figure 3:
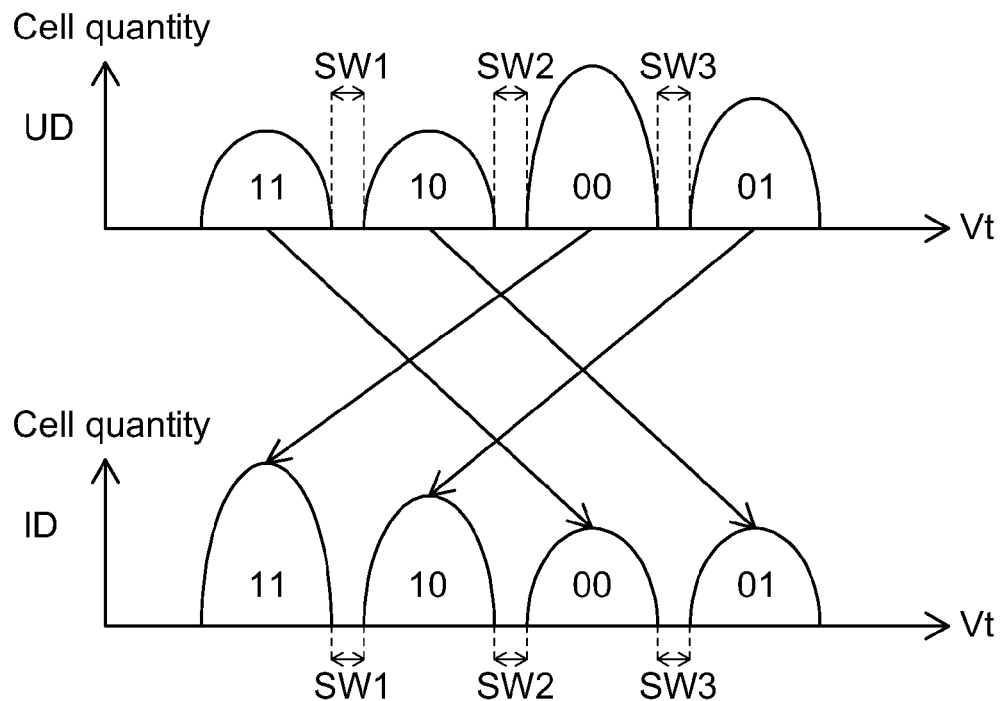
Figure 4:
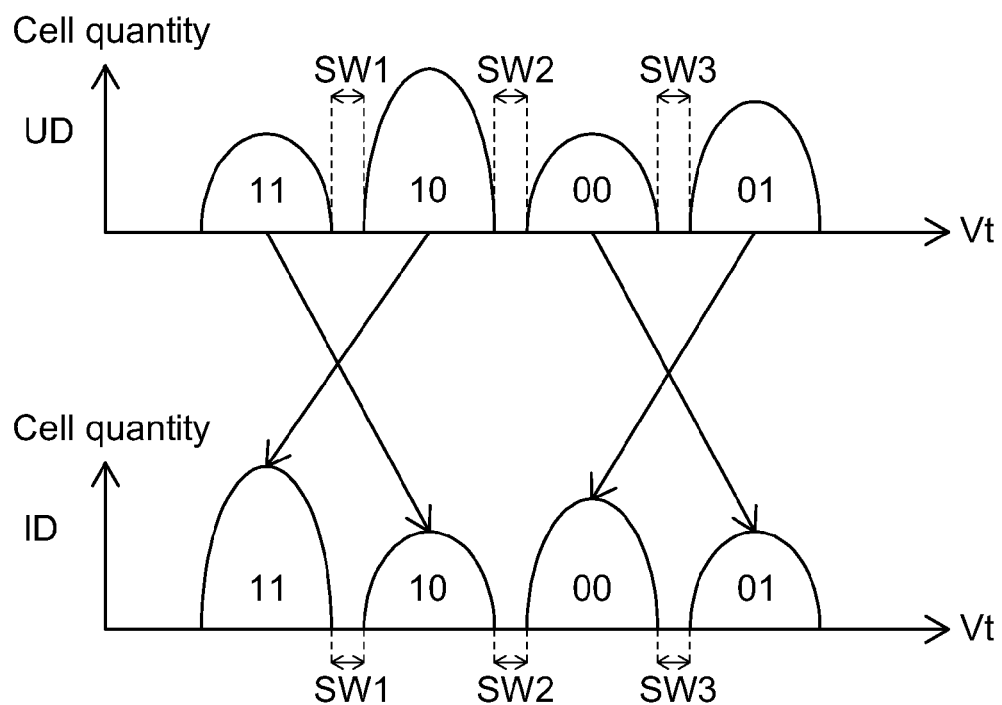

FIG. 2~FIG. 4 show reading distribution situations in one half cell (for example, left half cell), before and after bit inversion. In FIG. 2, the reading distribution "01" is widest/highest. In prior art, if the reading distribution "01" is too wide, then a serious second bit effect in the other half cell may occur (because there is too much charge trapped in the half cell, due to bit "0" in the high bit) and also, the sensing window SW1 is narrowed accordingly. Therefore, in this embodiment, after the controller 110 analyzes that the user data UD whose reading distribution "01" in a page is too wide (i.e. over a threshold situation), the controller 110 determines that high bits in the high page are inverted while the low bits in the low page are not inverted (i.e. the inverse bit related to the high page is set as "1" and the inverse bit related to the low page is set as "0"). Therefore, after bit inversion, the reading distribution in the first input data ID is as shown in FIG. 2. The reading distribution "11", "10", "00" and "01" in the user data UD are moved as the reading distribution "01", "00", "10" and "11" in the first input data ID. After bit inversion, the reading distribution "11" in the first input data ID is widest/highest. The second bit effect is reduced because compared with the user data, the first input data ID has fewer logic "0" bits and the sensing window SW1 is widened.

In FIG. 3, the reading distribution "00" is widest/highest. In prior art, the sensing window SW3 is narrowed. In this embodiment, after the controller 110 analyzes that the user data UD whose reading distribution "00" is too wide, the controller 110 determines that high bits in the high page are inverted while the low bits in the low page are inverted (i.e. the inverse bit related to the high page is set as "1" and the inverse bit related to the low page is set as "1"). Therefore, after bit inversion, the reading distribution in the first input data ID is as shown in FIG. 3. The reading distribution "11", "10", "00" and "01" in the user data UD are moved as the reading distribution "00", "01", "11" and "10" in the first input data ID. After bit inversion, the reading distribution "11" in the first input data ID is widest/highest. The second bit effect is reduced because compared with the user data, the first input data ID has fewer logic "0" bits and the sensing window SW3 is widened.

In FIG. 4, the reading distribution "10" is widest/highest. In prior art, the sensing window SW2 is narrowed. In this embodiment, after the controller 110 analyzes that the user data UD whose reading distribution "10" is too wide, the controller 110 determines that high bits in the high page are not inverted while the low bits in the low page are inverted (i.e. the inverse bit related to the high page is set as "0" and the inverse bit related to the low page is set as "1"). Therefore, after bit inversion, the reading distribution in the first input data ID is as shown in FIG. 4. The reading distribution "11", "10", "00" and "01" in the user data UD are moved as the reading distribution "10", "11", "01" and "00" in the first input data ID. After bit inversion, the reading distribution "11" in the first input data ID is widest/highest. The second bit effect is reduced because compared with the user data, the first input data ID has fewer logic "0" bits and the sensing window SW2 is widened.

In the embodiment, if the reading distribution "11" is widest/highest, the controller 110 determines that high bits in the high page are not inverted while the low bits in the low page are not inverted (i.e. the inverse bit related to the high page is set as "0" and the inverse bit related to the low page is set as "0").

However, in other embodiment of the invention, as discussed above, one page may be related to several inverse bits. If one page is divided into two sub-pages and each sub-page is related to one inverse bit, bits in the first sub-page of the page are inverted or not based on one of the inverse bits while bits in the second sub-page of the page is inverted or not based on another of the inverse bits. For example, if one page in the user data UD includes "00000111" (wherein the first sub-page being "0000" and the second sub-page being "0111"), then the inversion results (i.e. the first input data ID) are listed as follows.

| IB | ID |
|---|---|
| 00 | "00000111" (both the first sub-page and the second sub-page are not inverted) |
| 01 | "00001000" (the first sub-page is not inverted and the second sub-page is inverted) |
| 10 | "11110111" (the first sub-page is inverted and the second sub-page is not inverted) |
| 11 | "11111000" (both the first sub-page and the second sub-page are inverted) |

In the above example, the controller 110 determines whether to invert the first part and the second part of the page, so that the inversion result (i.e. the first input data ID) has many logic bits "1" as possible. For example, based on the above example, the controller may determine not to the first sub-page but to invert the second sub-page (i.e. the first inverted bit data IB being 01).

Also, in other embodiment, the four bits in the memory cell may be included in the same page, or in different pages. Alternatively, the two bits in the same half cell in the memory cell may be included in the same page, or in different pages.

The memory device and operation method thereof disclosed in the above embodiment have many advantages exemplified below. Sensing window is improved and second bit effect is also reduced because of the bit inversion.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:
1. A MLC (Multi-level cell) memory device, comprising:
a memory array, including a plurality of groups each storing a plurality of bits;

an inverse bit storage section, storing a first inverse bit data including a plurality of inverse bits, the plurality of bits in the same group in the memory array being related to a respective inverse bit; and a controller, coupled to the memory array and the inverse bit storage section for receiving an original data and outputting a first input data to the memory array, if the controller determines that a first threshold-voltage distribution of the original data is over a threshold situation, the controller generates the first input data by inverting bit values of a first portion of the original data but not inverting bit values of a second portion of the original data, so that the first input data and the original data have different threshold-voltage distribution;

if the controller determines that a second threshold-voltage distribution of the original data is over the threshold situation, the controller generates the first input data by inverting the bit values of the first portion of the original data and the bit values of the second portion of the original data, so that the first input data and the original data have different threshold-voltage distribution;

if the controller determines that a third threshold-voltage distribution of the original data is over the threshold situation, the controller generates the first input data by inverting the bit values of the second portion of the original data but not inverting the bit values of the first portion of the original data, so that the first input data and the original data have different threshold-voltage distribution; and if the controller determines that a fourth threshold-voltage distribution is over the threshold situation, the controller generates the first input data by not inverting the bit values of the original data.

2. The memory device according to claim 1, wherein:
the group is one of a sector, a block, a word line, a page and a sub-page;
bit number in each group is the same as or different from each other; and
values of bits in the same group are inverted or not based on the related inverse bit.

3. The memory device according to claim 1, wherein the inverse bit storage section is one of an inverse bit array and a register.

4. The memory device according to claim 1,
wherein the controller determines whether to invert the bit values of the original data, generates the first input data and the first inverse bit data to the memory array and the inverse bit storage section, respectively, the first inverse bit data indicating whether the bit values of the original data is inverted by the controller into the first input data or not, the memory device further comprises:
a sense amplifier group, coupled to the memory array and the inverse bit storage section, the sense amplifier group sensing a second input data output from the memory array and a second inverse bit data output from the inverse bit storage section, respectively and outputting a third input data and a third inverse bit data; and
a logic circuit, coupled to the sense amplifier group, inverting bit values of the third input data into an output data based on the third inverse bit data.

5. The memory device according to claim 2, wherein the controller inverts the bit values of the original data into the first input data so that the first input data has fewer logic "0" bits than the original data.

6. The memory device according to claim 1, wherein:
if the controller determines that a threshold-voltage distribution "01" of the original data is over the threshold situation, the controller generates the first input data by inverting the bit values of the first portion of the original data but not inverting the bit values of the second portion of the original data for arranging threshold-voltage distributions "11", "10", "00" and "01" in the original data into threshold-voltage distributions "01", "00", "10" and "11" in the first input data, respectively;

if the controller determines that a threshold-voltage distribution "00" of the original data is over the threshold situation, the controller generates the first input data by inverting the bit values of the first portion of the original data and the bit values of the second portion of the original data for arranging threshold-voltage distributions "11", "10", "00" and "01" in the original data into threshold-voltage distributions "00", "01", "11" and "10" in the first input data;

if the controller determines that a threshold-voltage distribution "10" of the original data is over the threshold situation, the controller generates the first input data by inverting the bit values of the second portion of the original data but not inverting the bit values of the first portion of the original data for arranging threshold-voltage distributions "11", "10", "00" and "01" in the original data into threshold-voltage distribution "10", "11", "01" and "00" in the first input data; and if the controller determines that a threshold-voltage distribution "11" is over the threshold situation, the controller generates the first input data by not inverting the bit values of the original data.

7. The memory device according to claim 1, wherein:
the memory array includes a plurality of memory cells; and
in the same word line of the memory array, a page includes consecutive memory cells or separated memory cells.

8. The memory device according to claim 7, wherein bits stored in the same memory cell belong to the same group; and bits stored in the same memory cell are inverted or not based on the same inverse bit.

9. The memory device according to claim 7, wherein bits stored in the same memory cell belong to different groups; and bits stored in the same memory cell are inverted or not based on respective inverse bits.

10. The memory device according to claim 7, wherein bits stored in the same half cell of the memory cell belong to the same group; and bits stored in the same half cell of the same memory cell are inverted or not based on the same inverse bit.

11. The memory device according to claim 7, wherein bits stored in the same half cell of the memory cell belong to different groups; and bits stored in the same half cell of the same memory cell are inverted or not based on respective inverse bits.

12. An operation method for a MLC (multi-level cell) memory device, the MLC memory device comprising a memory array, the operation method comprising steps of:
receiving an original data;
determining whether to invert bit values of the original data into a first input data;
if it is determined that a first threshold-voltage distribution of the original data is over a threshold situation, generating the first input data by inverting bit values of a first portion of the original data but not inverting bit values of a second portion of the original data, so that the first input data and the original data have different threshold-voltage distribution; if it is determined that a second threshold-voltage distribution of the original data is over the threshold situation, generating the first input data by inverting the bit values of the first portion of the original data and the bit values of the second portion of the original data, so that the first input data and the original data have different threshold-voltage distribution; if it is determined that a third threshold-voltage distribution of the original data is over the threshold situation, generating the first input data by inverting the bit values of the second portion of the original data but not inverting the bit values of the first portion of the original data, so that the first input data and the original data have different threshold-voltage distribution; and if it is determined that a fourth threshold-voltage distribution is over the threshold situation, generating the first input data by not inverting the bit values of the original data;

generating a first inverse bit data based on the determination, the first inverse bit data indicating whether the bit values of the original data is inverted into the first input data or not, the first inverse bit data including a plurality of inverse bits; and storing the first input data and the first inverse bit data into the memory device.

13. The method according to claim 12, wherein the step of determining whether to invert the bit values of the original data into the first input data includes:

inverting the bit values of the original data into the first input data so that the first input data has fewer logic "0" bits than the original data.

14. The method according to claim 12, wherein the step of determining whether to invert the bit values of the original data into the first input data includes:

if it is determined that a threshold-voltage distribution "01" of the original data is over the threshold situation, generating the first input data by inverting the bit values of the first portion of the original data but not inverting the bit values of the second portion of the original data for arranging threshold-voltage distributions "11", "10", "00" and "01" in the original data into threshold-voltage distributions "01", "00", "10" and "11" in the first input data, respectively;

if it is determined that a threshold-voltage distribution "00" of the original data is over the threshold situation, generating the first input data by inverting the bit values of the first portion of the original data and the bit values of the second portion of the original data for arranging threshold-voltage distributions "11", "10", "00" and "01" in the original data into threshold-voltage distributions "00", "01", "11" and "10" in the first input data;

if it is determined that a threshold-voltage distribution "10" of the original data is over the threshold situation, generating the first input data by inverting the bit values of the second portion of the original data but not inverting the bit values of the first portion of the original data for arranging threshold-voltage distributions "11", "10", "00" and "01" in the original data into threshold-voltage distribution "10", "11", "01" and "00" in the first input data; and if it is determined that a threshold-voltage distribution "11" is over the threshold situation, generating the first input data by not inverting the bit values of the original data.

15. The method according to claim 12, further comprising:

inverting values of bits stored in the same memory cell based on the same inverse bit if the bits stored in the same memory cell belong to the same group of the memory device.

16. The method according to claim 12, further comprising:

inverting values of bits stored in the same memory cell based on different inverse bits if the bits stored in the same memory cell belong to different groups of the memory device.

17. The method according to claim 12, further comprising:

inverting values of bits stored in the same half cell of the same memory cell based on the same inverse bit if bits stored in the same half cell of the memory cell belong to the same group.

18. The method according to claim 12, further comprising:

inverting values of bits stored in the same half cell of the same memory cell based on respective inverse bits if bits stored in the same half cell of the memory cell belong to different groups of the memory device.

* * * * *